US006655974B2

United States Patent
Nakano et al.

(10) Patent No.: US 6,655,974 B2
(45) Date of Patent: Dec. 2, 2003

(54) SEMICONDUCTOR DEVICE-SOCKET

(75) Inventors: Kazunori Nakano, Yokkaichi (JP); Ryo Ujike, Nishitokyo (JP); Kenji Ichihara, Kawasaki (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/152,032

(22) Filed: May 22, 2002

(65) Prior Publication Data
US 2002/0177344 A1 Nov. 28, 2002

(30) Foreign Application Priority Data

May 23, 2001 (JP) ........................................ 2001-154313

(51) Int. Cl.[7] ............................................... H01R 13/15
(52) U.S. Cl. ...................... 439/259; 439/266; 439/268; 439/330
(58) Field of Search ................................ 439/263–268, 439/259, 261, 330, 331, 68, 73

(56) References Cited

U.S. PATENT DOCUMENTS

| | | | | |
|---|---|---|---|---|
| 4,331,371 A | * | 5/1982 | Ichimura et al. | 439/269.1 |
| 5,545,050 A | * | 8/1996 | Sato et al. | 439/331 |
| 5,807,127 A | * | 9/1998 | Ohshima | 439/266 |
| 6,149,449 A | | 11/2000 | Abe | 439/268 |
| 6,371,782 B1 | * | 4/2002 | Ohashi | 439/266 |
| 6,537,093 B2 | * | 3/2003 | Kanesashi et al. | 439/268 |

FOREIGN PATENT DOCUMENTS

| | | |
|---|---|---|
| JP | 1-117076 | 8/1989 |
| JP | 9-55273 | 2/1997 |
| JP | 10-302925 | 5/1997 |
| JP | 2000-009752 | 1/2000 |
| JP | 2000-48923 | 2/2000 |
| JP | 2000-195631 | 7/2000 |

* cited by examiner

Primary Examiner—Tho D. Ta
Assistant Examiner—James R. Harvey
(74) Attorney, Agent, or Firm—Finnegan, Henderson, Farabow, Garrett & Dunner, LLP

(57) ABSTRACT

A plurality of contact terminals include movable contact portions disposed slantingly oppositely to each other, and the movable contact portion of the contact terminal is disposed movably up to the neighborhood of a position adjacent to the movable contact portion of the adjacent contact terminal. In this situation, when the electrode of the semiconductor device is released from the contact terminal, the electrode is pressed by the back of the movable contact portion in the direction where the electrode is separated from the movable contact portion.

13 Claims, 18 Drawing Sheets

SEMICONDUCTOR DEVICE-SOCKET

This application is based on Patent Application No. 2001-154313 filed May 23, 2001 in Japan, the content of which is incorporated hereinto by reference.

BACKGROUND OF THE INVENTION

1. Field of the Invention

The present invention relates to a semiconductor device-socket used for testing the semiconductor device.

2. Description of the Related Art

Semiconductor devices mounted on an electronic equipment or others are subjected to various tests at a stage prior to being actually mounted so that latent defects therein are removed. The test is performed nondestructively through application of voltage stress, high-temperature operation, and high-temperature storage corresponding to thermal and mechanical environment tests or the like. Among these tests, there is a burn-in test effective for removing initial-inoperable integrated circuits, in which an operation test is performed under a high temperature condition for a predetermined time.

A semiconductor device-socket subjected to such a test disclosed, for example, in Japanese Patent Application Laid-Open Nos. 10-302925 (1998) and 2000-009752, is disposed on a printed circuit board (a printed board) having an input/output section through which a predetermined test voltage is supplied to and an abnormality-detection signal representing a short-circuit or others is returned from the semiconductor device as an object to be tested and the abnormality-detection signal is transmitted.

Such a semiconductor device-socket comprises a socket body that is fixed onto the printed circuit board and accommodates a contact deviation member described later relatively movably with respect to a pair of movable contact portions of each contact terminal, a positioning member including an accommodation portion in which a semiconductor device of a BGA (Ball Grid Array)-type, for example, is loaded, a contact deviation member disposed in the socket body movably in a reciprocating manner in a predetermined direction to support a bottom of the positioning member and bringing the one of movable contact portion of the contact terminal described later in close proximity to the other of movable contact or keeping the one away from the other, and a frame member for transmitting operating force acting on itself to the contact deviation member as driving force through a driving mechanism (not shown) of the contact deviation member.

Each contact terminal includes a terminal on the side of a proximal end provided on the socket body corresponding to each electrode portion of the loaded semiconductor device, and a pair of movable contact portions coupled to the foregoing terminal for selectively pinching each electrode portion of the semiconductor device. The pair of the oppositely disposed movable contact portion are brought in close proximity to each other in response to the movement of the contact deviation member to pinch each electrode portion of the semiconductor device, or are kept away from each other by a predetermined distance to release each electrode portion of the semiconductor device. The distance (the amount of opening) between the pair of the movable contact portions is set to a value that is obtained by adding the diameter of each electrode portion of the semiconductor device and a predetermined gap such that loading and unloading of the semiconductor device are possible, for the example.

The contact deviation member is movably arranged in an accommodation portion of the socket body in the movement direction of the movable contact portion of each contact terminal, and includes a plurality of openings from which the pair of the movable contact portions of each contact terminal are protruded, respectively. Adjacent each opening is divided between a partition wall.

At peripheral edges of the respective openings in the contact deviation member from which the movable contact portions of the respective contact terminals are protruded (between the openings), there is provided the partition wall portion as a movable contact pressing portion. The partition wall portion is formed to divide a space between the one of the movable contact portion and the other.

In such a construction, when a semiconductor device is accommodated in the accommodation portion of a positioning member, first the aforementioned frame member is made to lower to move the contact deviation member in one direction. Then, in the situation where the partition wall member as the movable contact pressing portion is moved and held such that the one movable contact portion of each contact terminal is spaced with respect to the other movable contact portion, the semiconductor device is placed on a bottom of the accommodation portion of the positioning member, which permits each electrode portion of the semiconductor device to be positioned between the movable contact portions of the respective electrode portions.

When the frame member is moved upward, the contact deviation member is moved in the opposite direction to the one direction by restoring force of the movable contact up to an initial position to permit the partition wall portion to be separated from the one of the movable contact and brought into contact with the other. The pair of the movable contact portions of each contact terminal are thereupon brought in close proximity to each other.

Accordingly, each electrode portion of the semiconductor device is pinched by the pair of the movable contact portions of each contact terminal to electrically connect each electrode portion of the semiconductor device with each contact terminal.

Thereafter, a predetermined inspection signal is supplied to the printed circuit board to enable the aforementioned burn-in test to be performed.

For removing the semiconductor device from the bottom of the accommodation portion in the positioning member after the completion of the aforementioned burn-in test, the foregoing frame member is again moved downward, causing the partition wall portion of the contact deviation member to be moved such that the one of the movable contact of each contact terminal is spaced with respect to the other.

There is however a situation where the other of the movable contact in the contact terminals among the plurality of the contact terminals bites the electrode portion of the semiconductor device formed of solder, etc. on the temperature condition of the burn-in test, and hence it may be difficult to remove the semiconductor device from the bottom of the accommodation portion in the positioning member.

Further, for example, as illustrated in FIG. 18, the respective contact terminals 6 each including the movable contact portions 6A, 6B may be arranged in a line corresponding to the respective electrode portions 10 of the semiconductor device. Further, FIG. 18 illustrates a situation where the partition wall portions 4A, 4B of the contact deviation member 2 disposed between the movable contact portions 6A and 6B are moved in one direction, and the movable contact portion 6A of the contact terminal 6 is separated from the movable contact portion 6B.

The respective electrode portions 10 of the semiconductor device are positioned between the movable contact portions 6A and 6B. An opening portion 8, from which the movable contact portions 6A and 6B are protruded, is formed between the partition wall portion 4A and the partition wall portion 4B.

The amount L of the opening of each contact terminal 6 has a predetermined limitation owing to a mutual distance between the electrode portions 10 of the semiconductor device. There might therefore happen the possibility that the amount L of the opening of each contact terminal 6 is not enough as each electrode portion 10 of the semiconductor device become ever-denser.

SUMMARY OF THE INVENTION

In view of the aforementioned problems with the prior art, it is an object of the present invention to provide a semiconductor device-socket for use in a test for the semiconductor device, wherein the amount of the opening of the contact terminal is enough ensured without being influenced by the density of the electrode portions of the semiconductor device, and further the movable contact portion of the contact terminal is reliably spaced from the electrode portion of the semiconductor device.

To achieve the above object, a semiconductor device-socket according to the present invention comprises: a plurality of contact terminals, each of which includes a first movable contact portion and a second movable contact portion slantwise disposed and opposite to the direction of movement of the first movable contact, for selectively pinching an electrode portion of a semiconductor device in cooperation with the first movable contact, and electrically connects the electrode portion of the semiconductor device; a supporting member for supporting proximal ends of the plurality of contact terminals such that the first movable contact portion of the adjacent one of the contact terminals and the second movable contact portion of the other contact terminal are adjacent to each other; a contact deviation member disposed relatively movably with respect to the supporting member, the contact deviation member including a press section for pressing the first movable contact portion in such manner as to press the first movable contact portion of the contact terminal against the second movable contact portion so as to bring the first movable contact portion into or out of close proximity to the second movable contact portion and separate the electrode portion of the semiconductor device from the second movable contact; and driving means for relatively moving the contact deviation member with respect to the supporting member.

Further, plurality of the contact terminal section are disposed so that when the first movable contact portions are pressed such that a row of the first movable contact portions and a row of the second movable contact portions are arranged substantially in parallel to each other and the electrode of the semiconductor device is separated from the second movable contact portions, the second movable contact portions are disposed between the adjacent first movable contact portions.

The first movable contact may be formed into a bifurcated configuration having a gap oppositely to the second movable contact.

Further, the semiconductor device-socket according to the present invention comprises: a plurality of contact terminals, each of which includes a first movable contact portion and a second contact portion for selectively pinching an electrode portion of the semiconductor device in cooperation with the first movable contact portion and electrically connects the electrode portion of the semiconductor device; a positioning member including an accommodation portion for accommodating the semiconductor device therein, the positioning member for relatively positioning the electrode portion of the semiconductor device with respect to the first movable contact portion and the second movable contact portion; a supporting member for supporting the proximal ends of the plurality of contact terminals; a contact deviation member disposed relatively movably with respect to the supporting member, the contact deviation member including a press section for pressing the first movable contact portion of the contact terminal section in such a manner as to press the first movable contact portion against the second movable contact portion so as to bring the first movable contact portion into or out of close proximity to the second movable contact portion; and a press member including a press surface section for pressing an outer configuration section of the semiconductor device in a direction in which the electrode portion of the semiconductor device accommodated in the accommodation portion is separated from the second movable contact portion, when the first movable contact portion is separated from the second movable contact portion by the contact deviation member.

Further, the plurality of the contact terminals, each of which may include a first movable contact portion and a second movable contact portion slantwise disposed and opposite to the direction of movement of the first movable contact, for selectively pinching an electrode portion of a semiconductor device in cooperation with the first movable contact, and electrically connects the electrode portion of the semiconductor device, the supporting member may support proximal ends of the plurality of contact terminals such that the first movable contact portion of the adjacent one of the contact terminals and the second movable contact portion of the other contact terminal are adjacent to each other.

As clarified from the aforementioned description, in accordance with the semiconductor device-socket of the present invention, there are provided the first movable contact and the second movable contact disposed facing the first movable contact slantingly with respect to the direction of the movement of the first movable contact for selectively holding the electrode portion of the semiconductor device, and the plurality of the contact terminals are provided each for electrically connecting the electrode portions of the semiconductor device, and further the contact deviation member includes the press section that is disposed relatively movably with respect to the supporting member for pressing the first movable contact of the contact terminal against the second movable contact, and bringing the former to close contact with the latter or separating the former from the latter and pressing the first movable contact so as to separate the electrode portion of the semiconductor device from the second movable contact, whereby the degree of opening of each contact terminal is enough secured without being influenced by the density of the electrode portions of the semiconductor device, and further the movable contact of the contact terminal is securely separated from the electrode portion of the semiconductor device.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2:
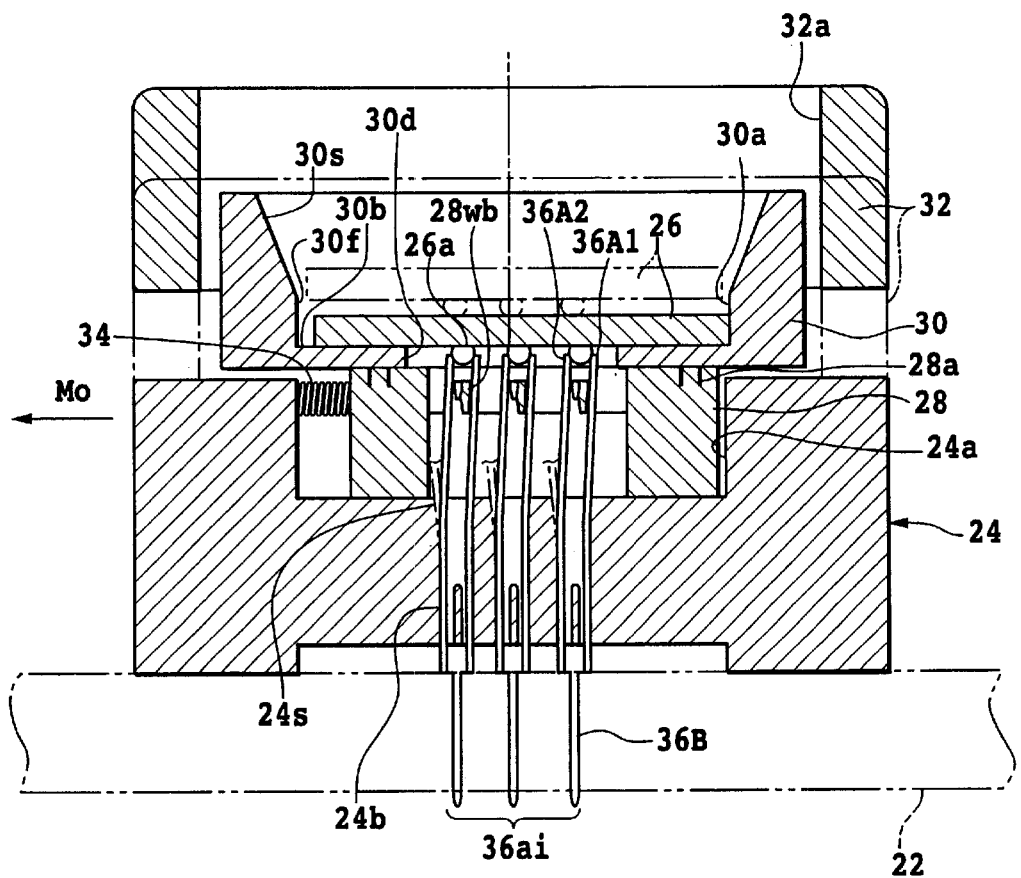
FIG. 2 is a cross sectional view schematically illustrating the important point of the arrangement of the first embodiment of a semiconductor device-socket according to the present invention together with the semiconductor device loaded on the socket.

Referring here to FIG. 2, a first embodiment of a semiconductor device-socket according to the present invention is illustrated.

The semiconductor device-socket according to the first embodiment is disposed on a printed circuit board 22 including an input/output section through which a predetermined test voltage is supplied to and an abnormality-detection signal representing a short-circuit or others is returned from the semiconductor device as an object to be tested and the abnormality-detection signal is transmitted.

The semiconductor device-socket comprises a socket body 24 fixed onto the printed circuit board 22 for accommodating a contact deviation member 28 described later relatively movably with respect to a pair of movable contact portions of a contact terminal 36ai, a positioning member 30 including an accommodation portion 30a on which the semiconductor device 26 of a BGA (Ball Grid Array)-type for example is loaded, the contact deviation member 28 that is disposed in the socket body 24 in a predetermined direction in a reciprocating manner for supporting a bottom of the positioning member 30 and for bringing the one of the movable contact portion 36A2 of a contact terminal 36ai described later into or out of close proximity to the other of movable contact point 36A1, and a frame member 32 for transmitting an operating force acting on itself to the contact deviation member 28 as driving force through a driving mechanism (not shown) of the contact deviation member 28.

A plurality of groups of electrode portions electrically connected with the input/output section through a conductive layer are formed corresponding to the socket body 24 at predetermined positions on the printed circuit board 22. Connected to the group of the electrode portions is a terminal 36B on the side of the proximal ends of the plurality of the contact terminals 36ai (i=1 to n, n is an integer) provided on the socket body 24 disposed on the printed circuit board 22.

The socket body 24 includes an accommodation portion 24a therein from which movable contact portions 36A2 and 36A1 of the plurality of the contact terminals 36ai are protruded. A plurality of through holes 24b which the proximal end of each contact terminal 36ai is press-fitted respectively, are provided on the bottom of the accommodation portion 24a. Each through-hole 24b is provided corresponding to the aforementioned group of the electrode portions and the electrode portion 26a of the loaded semiconductor device 26. A slope 24s is formed on a bottom side of the accommodation portion 24a on a wall surface that forms each through-hole 24b, as illustrated in FIG. 2. The slope 24s is inclined with a right downward so as to guide the one movable contact portion 36A2 of the contact terminal 36ai, as illustrated in FIG. 2 by a chain double-dashed line.

Each contact terminal 36ai comprises a terminal 36B located on the side of the proximal end provided on the socket body 24 corresponding to each electrode portion 26a of the semiconductor device 26 to be loaded, and a pair of the movable contact portions 36A1 and 36A2 coupled to the terminal 36B for selectively pinching each electrode portion 26a of the semiconductor device 26.

Figure 3A:
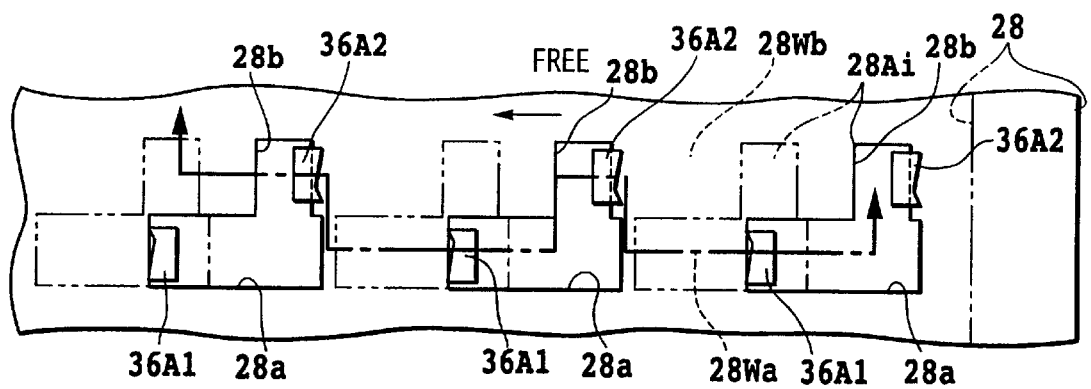
FIG. 3A is a view illustrating made available for the operation explanation of an example illustrated in FIG. 2.
Figure 3B:
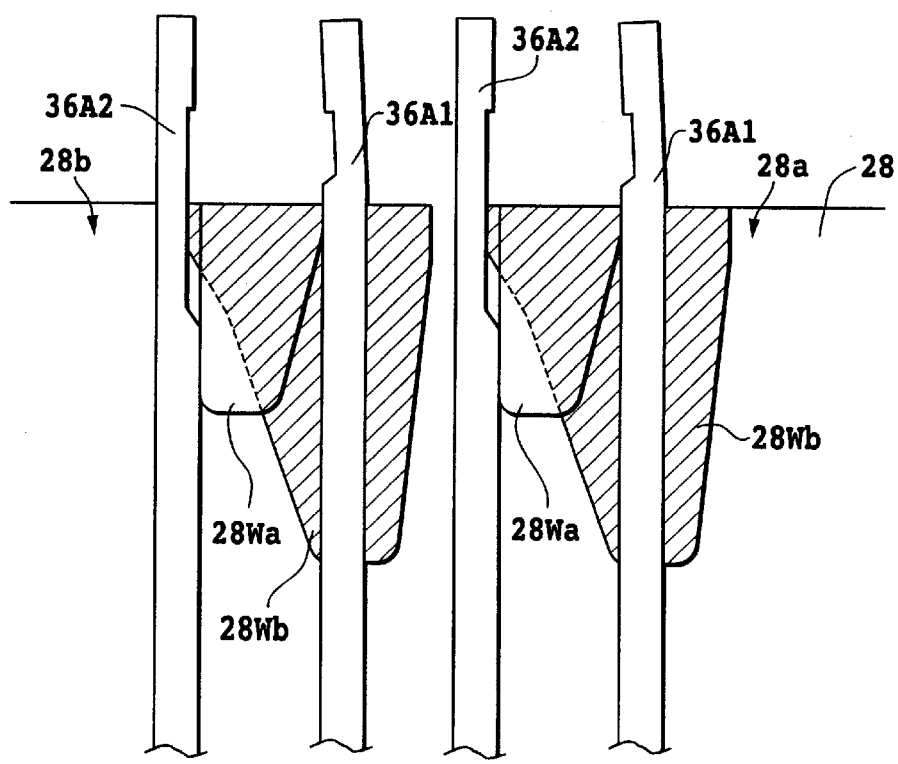
FIG. 3B is a partial cross sectional view of FIG. 3A.

The movable contact portion 36A2 of each contact terminal 36ai is provided side by side movably in the left and right directions in FIG. 2 relatively with respect to the movable contact portion 36A1. More specifically, as illustrated in FIG. 3A, the position of the movable contact portion 36A2 of each contact terminal 36ai is located in the slanting other side with respect to the movable contact portion 36A1. Further, each movable contact portion 36A1 is disposed between the mutual movable contact portions 36A2 of the adjacent contact terminals 36ai in the initial state. In other words, each movable contact portion 36A2 is disposed between the mutual movable contact portions 36A1 of the adjacent contact terminals 36ai in the initial state. FIGS. 3A and 3B as described later illustrate parts of the plurality of the contact terminals 36ai.

Figure 4A:
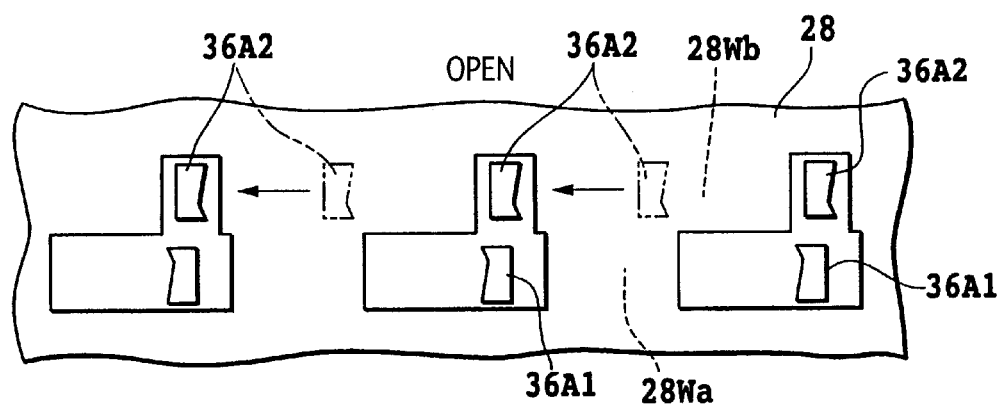
FIG. 4A is a view made available for the operation explanation of the example illustrated in FIG. 2.
Figure 4B:
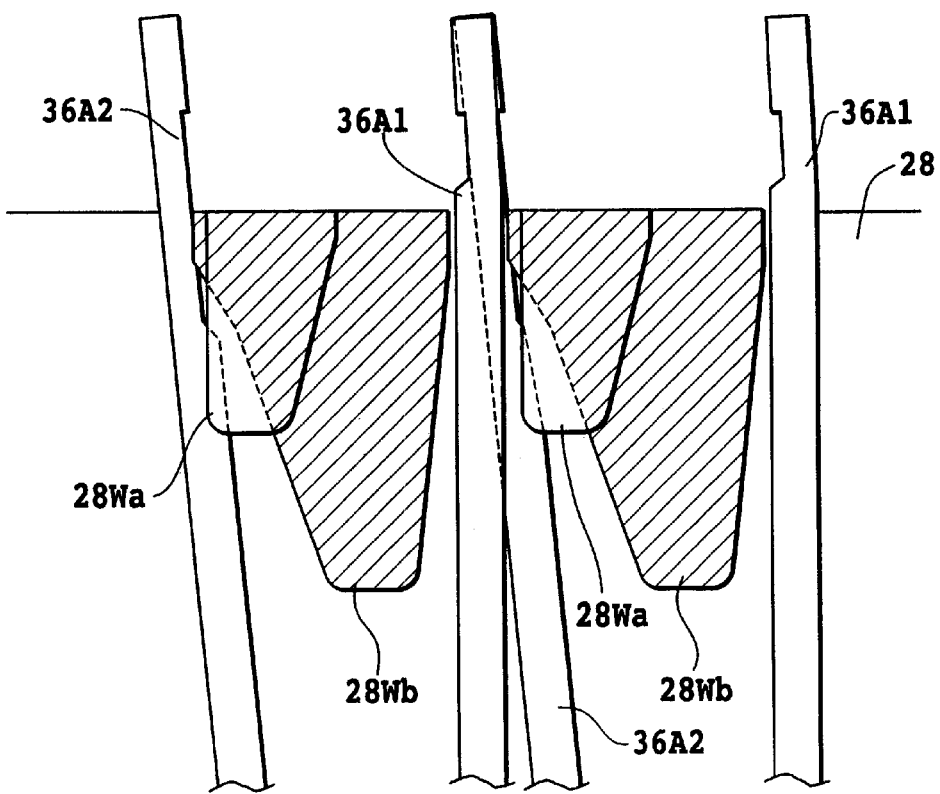
FIG. 4B is a partial cross sectional view of FIG. 4A.

Accordingly, the pair of the movable contact portion 36A1 and 36A2 are brought in close proximity to each other in response to the movement of the contact deviation member 28 to pinch each electrode portion 26a of the semiconductor device 26, or they are separated from each other to release each electrode portion 26a of the semiconductor device 26, as illustrated in FIGS. 3B and 4B.

The contact deviation member 28 is disposed in the accommodation portion 24a of the socket body 24 movably in the direction of the movement of the movable contact portions 36A1 and 36A2 of each contact terminal 36ai. The contact deviation member 28 includes a plurality of opening portions 28Ai (i=1 to n, n is an integer.) criss-crossed through which the movable contact portions 36A1 and 36A2 of each contact terminal 36ai are protruded at a given distance.

Each L-shaped opening portion 28Ai includes a rectangular portion 28a that moves without being interfered with the movable contact portion 36A1, and a portion 28b that is communicated with the portion 28a and moved without being interfered with the movable contact portion 36A2 and further comes in contact with the end. The rectangular portion 28b having a shorter length than that of the portion 28a is protruded from the end of the portion 28a in the direction perpendicular to the direction of the movement of the movable contact portion 36A1. The opening portions 28Ai are arranged such that the portions 28a thereof are spaced in a line at a given distance, as illustrated in FIG. 3A.

Between portion 28a and the portion. 28a of the adjacent opening portions 28Ai, it is divided with a partition wall 28wa, as illustrated in FIG. 3A and FIG. 3B. Further, between the portion 28b and the portion 28b of the adjacent openings 28Ai, it is divided with a partition wall 28wb serving as the movable contact press portion, as illustrated in FIGS. 3A and 3B. The partition walls 28wa and 28wb are formed integrally with the other portions. A cross sectional configuration of the partition walls 28wa and 28wb are taken as a trapezoid having a straight line section contacted with the movable contact portions 36A1 or 36A2, respectively. The width and height of the cross sectional configuration of the partition wall 28wa illustrated in FIG. 3B are smaller than the width of the partition wall 28wb and the height of the same in the cross section of the same.

Accordingly, when the contact deviation member 28 is moved as indicated by the chain double-dashed line in the direction of an arrow in FIG. 3A, the movable contact portion 36A2 is brought into contact with a peripheral edge of the portion 28b of the opening 28Ai and is moved together with contact deviation member 28 from a first position in FIG. 3A to an adjacent second position to the movable contact portion 36A1 of the adjacent contact terminal 36ai as illustrated in FIG. 4A. Hereby, a distance between the movable contact portion 36A1 and the movable contact portion 36A2 reaches a distance exceeding the diameter of the electrode portion 26a of the semiconductor device 26.

Between the one end of the contact deviation member 28 and an inner periphery of the accommodation portion 24a of the socket body 24 is provided a coiled spring 34 as an urging member for urging the contact deviation member 28 in the state illustrated in FIG. 4A to return the member 28 to an initial position in the state illustrated in FIG. 3A by a solid line.

Recessed portions 28a each having a cylindrical cross section, engaged to the protruded portions of the positioning member 30 are provided at four positions in the upper end of the contact deviation member 28 which the bottom of the positioning member 30 is placed.

Accordingly, the contact deviation member 28 disposed between the bottom of the positioning member 30 and the bottom surface of the accommodation portion 24a is capable of sliding relatively in the predetermined range with respect to the bottom surface of the accommodation portion 24a accompanying the positioning member 30.

Further a pair of engagement pins (not shown) provided on the outer periphery of the contact deviation member 28 are coupled with an elongated hole in a lever member of the driving mechanism for moving the contact deviation member 28 in response to elevation motion of the frame member 32, respectively. The engagement pins are provided at the side of the one end of the contact deviation member 28, for example.

The proximal end of each lever member of the foregoing driving mechanism has a through hole engaged moving rotationaly with a support shaft provided on an inner peripheral portion of the accommodation portion 24a of the socket body 24.

The tip end of each lever member is disposed at all times coming in contact with a lower end surface of the frame member 32 or in opposition to the same at a predetermined gap.

Hereby, as illustrated in FIG. 2 by the chain doubled-dashed line, the tip end of each lever member is moved rotationaly anticlockwise for example. Accordingly, the contact deviation member 28 is moved against the urging force of the coiled spring 34 in the direction indicated by an arrow Mo in FIG. 2.

In that case, as illustrated in FIGS. 4A and 4B, each partition wall 28Wb of the contact deviation member 28 separates the movable contact portion 36A2 of each contact terminal 36ai from the movable contact portion 36A1, and is moved such that the movable contact portion 36A2 adjoins the movable contact portion 36A1 of the adjacent contact terminal 36ai.

In contrast, the contact deviation member 28 is moved oppositely to the aforementioned direction by means of the urging force of the coiled spring 34 and the restoring force of the movable contact portion 36A2 in response to rising operation of the frame member 32.

An inner peripheral surface of the positioning member 30 disposed on an upper end of the contact deviation member 28 is so formed as to be surrounded by a flat surface 30f where an end surface of a side on the one side of the rectangle semiconductor device 26 and opposite side surfaces connected continuously with the end surface are brought in contact with each other, a slope 30s that couples an upper end surface thereof and the foregoing flat surface 30f, and a bottom surface 30b intersecting the flat surface 30f. The opening portion 30d is formed at the center of the bottom surface 30b.

A spacing between opposing flat surfaces 30f in the positioning member 30 is set larger than the length of one side of the semiconductor device to be mounted, keeping predetermined tolerance.

Upon mounting semiconductor device 26 on the semiconductor device-socket, when the semiconductor device 26 with such a construction held by a robot hand (not shown) is accommodated in the accommodation portion 30a of the positioning member 30 through the opening 32a of the frame member 32, for example, the frame member 32 is first moved downward with a robot hand (not shown) up to a position indicated by a chain double-dashed line in FIG. 2. At that time, a predetermined gap is formed between a lower end surface of the frame member 32 and the upper end surface of the socket body 24.

Hereby, the contact deviation member 28 is moved against the urging force of the coiled spring 34 with the aid of the movement mechanism of the contact deviation member 28. Accordingly, when the contact deviation member 28 is moved against the urging force of the coiled spring 34 in the direction indicated by an arrow Mo, the partition wall 28Wb in the state of the first position illustrated in FIG. 3A presses the movable contact portion 36A2 to separate the movable contact portion 36A2 from the movable contact portion 36A1 as shown in FIGS. 4A and 4B and move the movable contact portion 36A2 up to a second position adjacent to the movable contact portion 36A1 of the adjacent contact terminal 36ai.

Next, referring then to FIGS. 4A and 4B, in the case where the movable contact portion 36A2 of each contact terminal 36ai is separated from the movable contact portion 36A1 to be held, the semiconductor device 26 is positioned by being placed on the bottom of the accommodation portion 30a of the positioning member 30, whereby the electrode portion 26a of the semiconductor device 26 is positioned between the movable contact portion 36A1 and the movable contact portion 36A2 of each contact terminal 36ai through an opening 30d in the bottom thereof.

And then, when the frame member 32 is raised with the aid of releasing force of the robot hand and is suspended at a position indicated by a solid line in FIG. 2, the contact deviation member 28 is moved oppositely to the direction indicated by the arrow Mo by making use of the urging force of the coiled spring 34 and the restoring of the movable contact portion 36A2, and thereafter the contact deviation member 28 is paused.

Figure 5A:
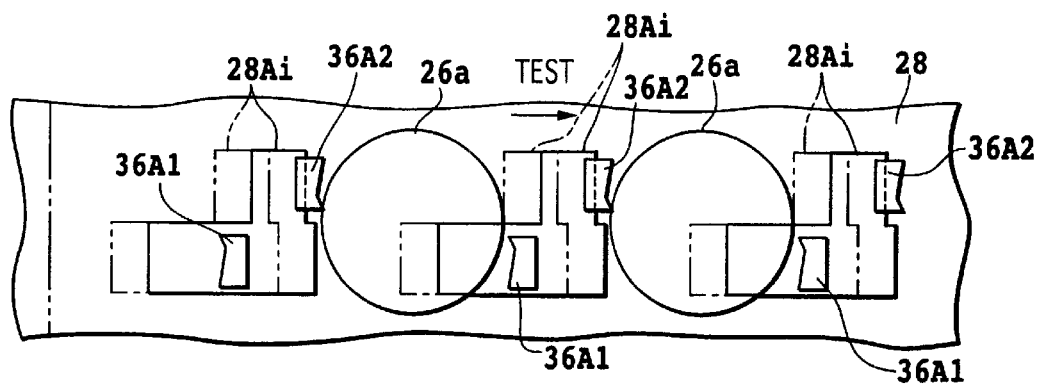
FIG. 5A is a plan view illustrating the arrangement of a contact terminal with an electrode portion of a semiconductor device pinched in the example illustrated in FIG. 2.
Figure 5B:
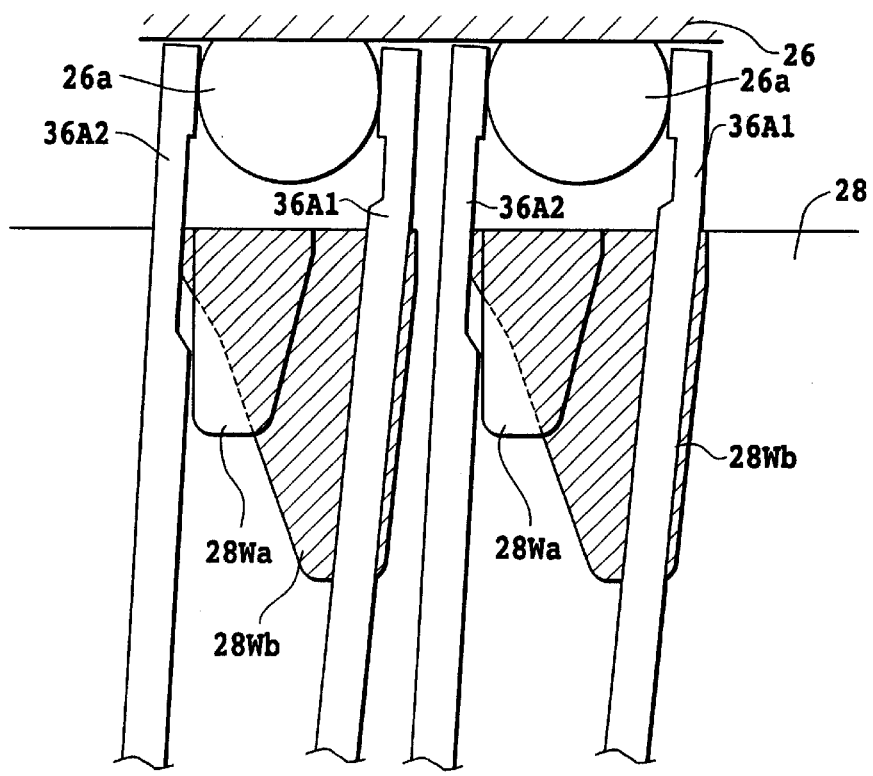
FIG. 5B is a partial cross sectional view of FIG. 4A.

Accordingly, referring thus to FIGS. 5A and 5B, the electrode portion 26a of the semiconductor device 26 is pinched between the movable contact portion 36A1 of each contact terminal 36ai and the movable contact portion 36A2 of the same.

Thereafter, in a predetermined atmosphere a predetermined inspection signal is supplied to the semiconductor device 26 through the printed circuit board 22 and the group of the contact terminal 36ai to execute a test for the semiconductor device 26.

Figure 6A:
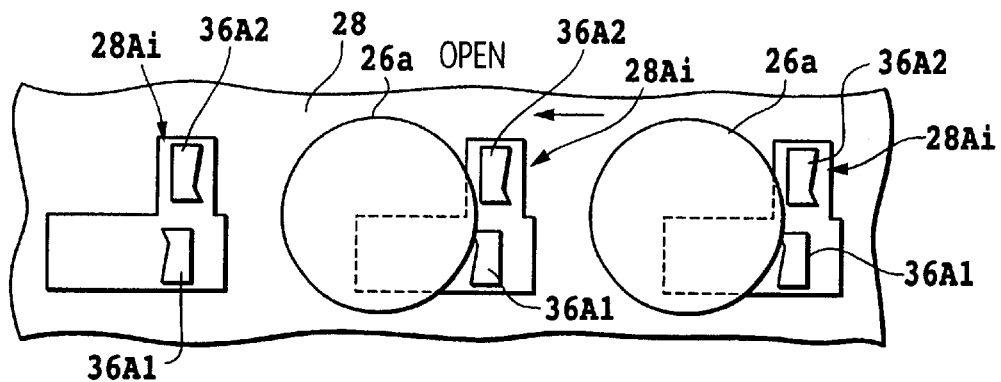
FIG. 6A is a view made available for the operation explanation of the example illustrated in FIG. 2.
Figure 6B:
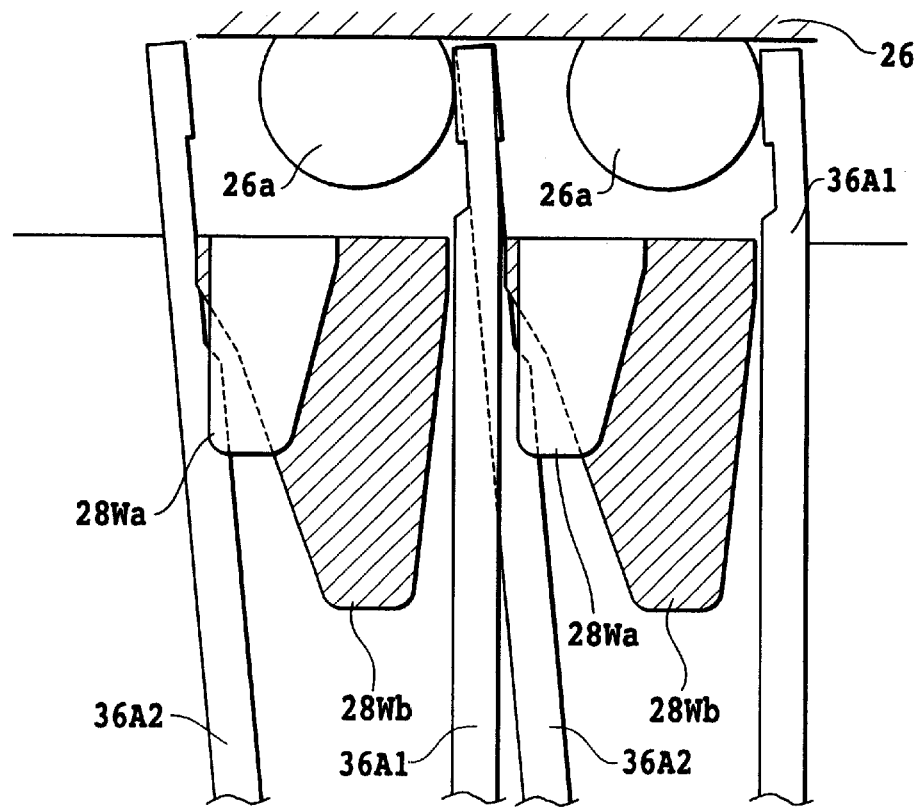
FIG. 6B is a partial cross sectional view of FIG. 6A.

Further, when the semiconductor device 26 that is completed in its test is demounted from the semiconductor device-socket, the frame member 32 is moved downward again with the aid of a robot hand (not shown) up to the position indicated by the chain double-dashed line in FIG. 2 as above, and thereafter as illustrated in FIGS. 6A and 6B the movable contact portion 36A2 of each contact terminal 36ai is separated from the electrode portion 26a of the semiconductor device 26 and is moved up to a second position adjacent to the movable contact portion 36A1 of the adjacent contact terminal 36ai.

Subsequently, the frame member 32 is further moved downward by a predetermined distance to move the movable contact portion 36A2 of each contact terminal 36ai up to a third position beyond the aforementioned second position as enlargedly illustrated, in FIG. 1B in a solid line.

Figure 1A:
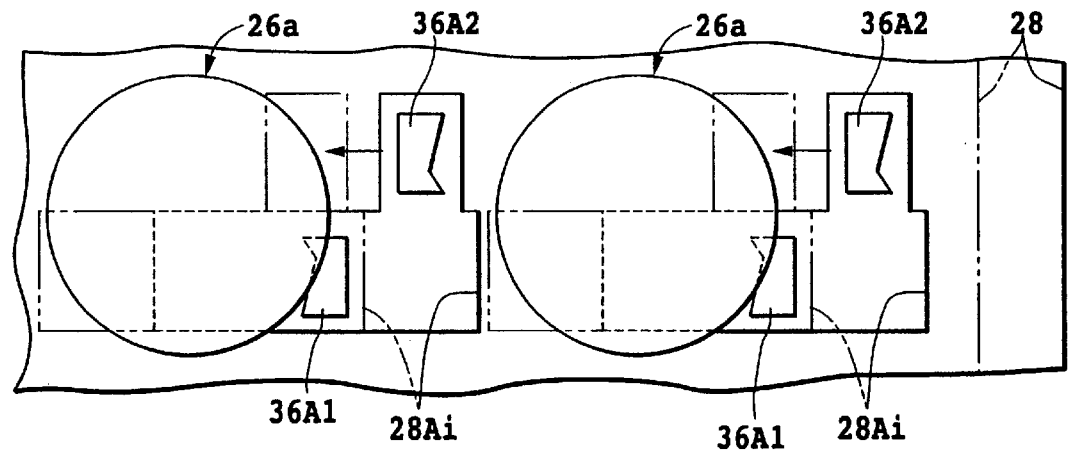
FIGS. 1A and 1B are views made available for the operation explanation of a first preferred embodiment of a semiconductor device-socket according to the present invention, respectively.
Figure 1B:
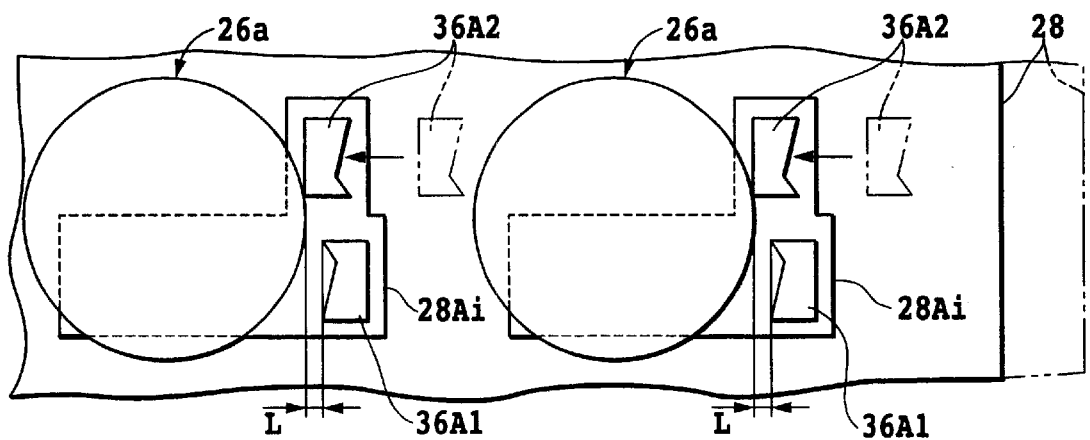

Hereby, as enlargedly illustrated, in FIG. 1B, a flat back without any protrusion in the movable contact portion 36A2 presses the adjacent electrode portion 26a in the semiconductor device 26 to move such that electrode portion 26a is separated from the movable contact portion 36A1 by a predetermined distance L.

At that time, the back of the movable contact portion 36A2 is brought into contact with the vicinity of a portion where the movable contact portion 36A1 contacts in the adjacent electrode portion 26a, i.e., the vicinity of a central line of the electrode portion 26a from the second position away from the adjacent electrode section 26a, as illustrated in FIG. 1A. Thereafter, the back is moved up to a position indicated by a solid line from the position indicated by a chain double-dashed line, i.e., up to a third position where the electrode portion 26a is separated from the movable contact portion 36A1 by a predetermined distance L.

Accordingly, since the electrode portion 26a of the semiconductor device 26 is securely separated from the movable contact portion 36A1 of the contact terminal 36ai, the so-called biting of the movable contact portion 36A1 of the contact terminal 36ai is avoided. Additionally, since the surface of the electrode portion 26a of the semiconductor device 26 is pressed by the flat back of the movable contact portion 36A2, there is no possibility that the surface of the electrode portion 26a is damaged.

Figure 7:
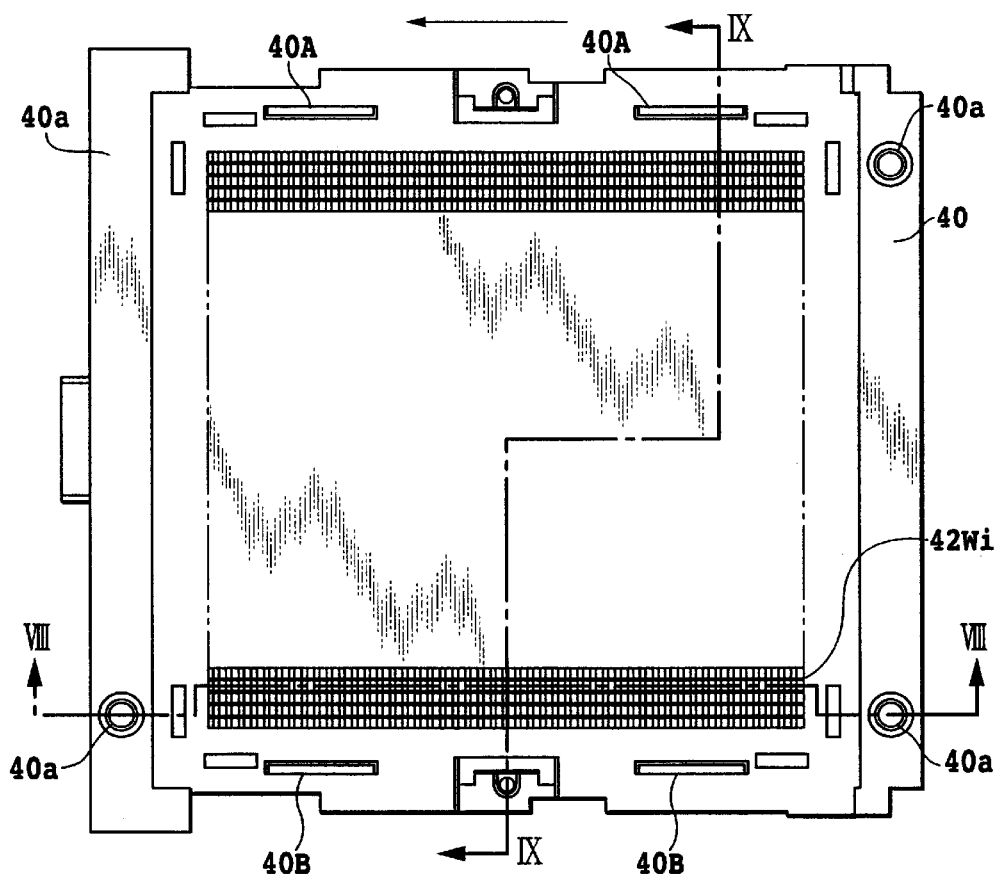
FIG. 7 is a plan view illustrating an outer appearance of a contact deviation member for use in a second embodiment of the semiconductor device-socket according to the present invention.

FIG. 7 illustrates a contact deviation member for use in a second preferred embodiment of a semiconductor device-socket according to the present invention.

It should be noted that the present embodiment also comprises such a printed circuit board 22 as well as board of the first embodiment, a socket body for accommodating the contact deviation member relatively movably with respect to a pair of the movable contact points of the contact terminal, a positioning member including an accommodation portion in which such a semiconductor device 26 as described above is mounted, and a frame member for transmitting operating force to the contact deviation member as driving force through a driving mechanism of the contact deviation member.

Figure 10:
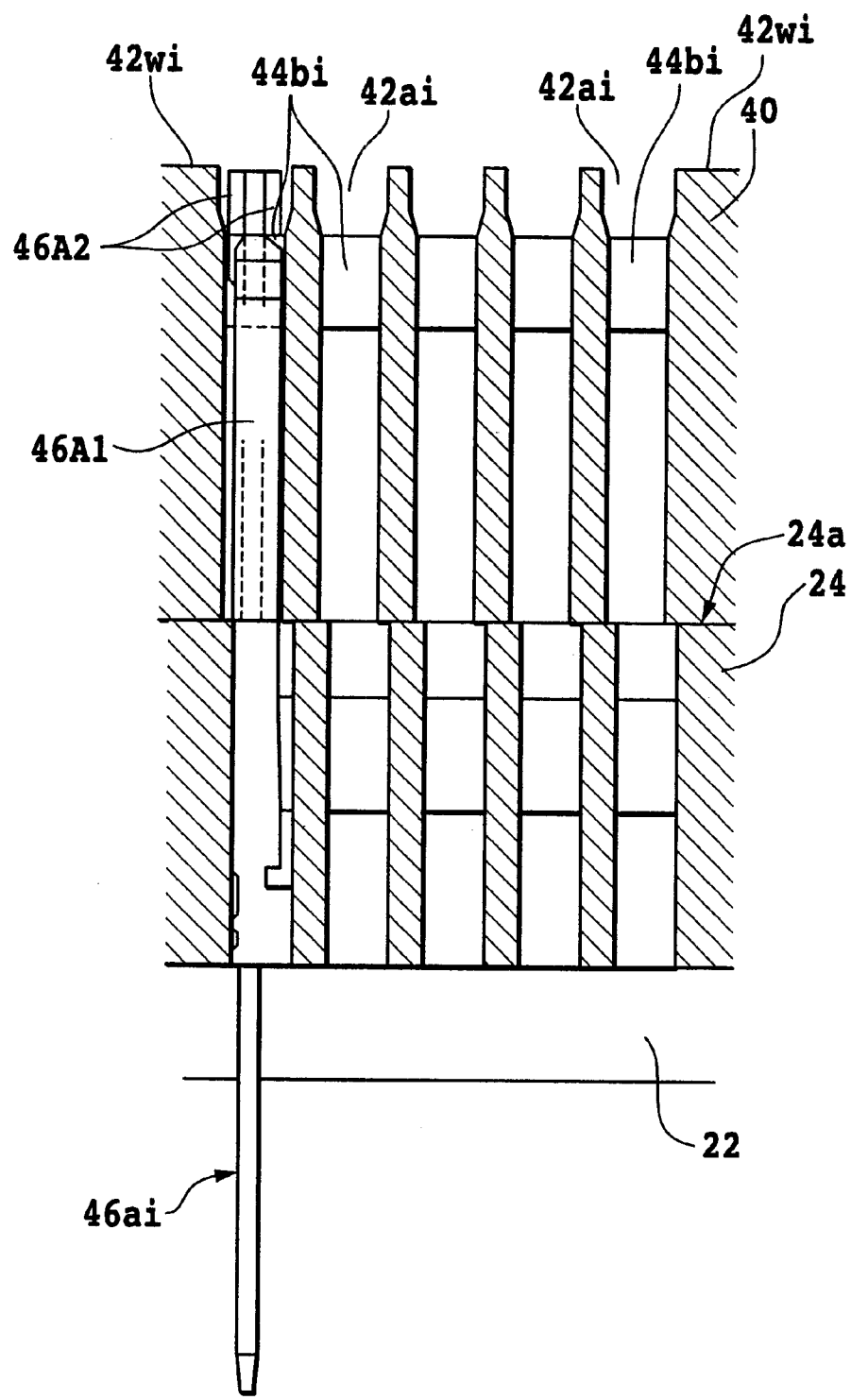
FIG. 10 is a partial cross sectional view illustrating the enlarged construction of a contact terminal, a contact deviation member, and a socket body for use in the second embodiment of semiconductor device-socket according to the present invention.

Referring further to FIG. 10, the contact deviation member 40 is disposed slidably in the accommodation portion 24a of the socket body 24 as well as that constructed in the aforementioned example.

Recessed portions 40a at two positions are provided at a predetermined interval in the opposite ends of upper surface of the contact deviation member 40, to which the aforementioned positioning member is fixed. Into the recessed portion 40a, having an annular cross sectional configuration is fitted a cylindrical protrusion provided on the bottom of the positioning member.

Pawl sections 40A and 40B engaged movably in a reciprocating manner with a groove of the socket body 24 are provided at two positions on each side of the contact deviation member 40 in the direction indicated by an arrow in FIG. 7, i.e. in the direction of the movement of the contact deviation member 40. The pawl sections 40A and 40B are protruded toward the socket body 24.

Figure 9:
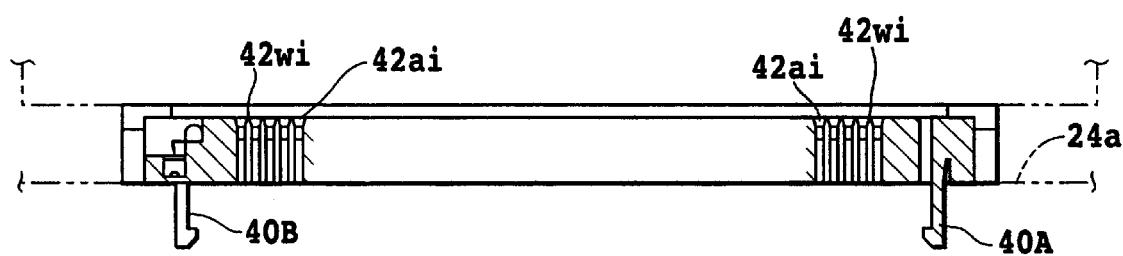
FIG. 9 is a cross sectional view taken along the line IX—IX indicated in FIG. 7.

As shown in FIGS. 7 and 9, a plurality of the partition walls 42 (i=1 to n, n is an integer.) extending in the direction indicated by an arrow are formed mutually in parallel with a predetermined interval substantially at the center of the contact deviation member 40. The interval between the adjacent partition walls 42wi is set corresponding to the spacing between the electrode portions 26a of the semiconductor device 26.

Spaces 42ai (i=1 to n, n is an integer.) are formed between the adjacent partition wall portions 42wi as enlargedly indicated in FIG. 10.

On an upper portion between the adjacent partition walls 42wi are so formed as to couple the adjacent partition walls 42wi partition walls 44bi (i=1 ton, n is an integer.) as movable contact press portions for dividing each space 42ai into a plurality of subspaces in the direction substantially perpendicular to the direction of the arrangement of the partition walls 42wi.

Figure 8:
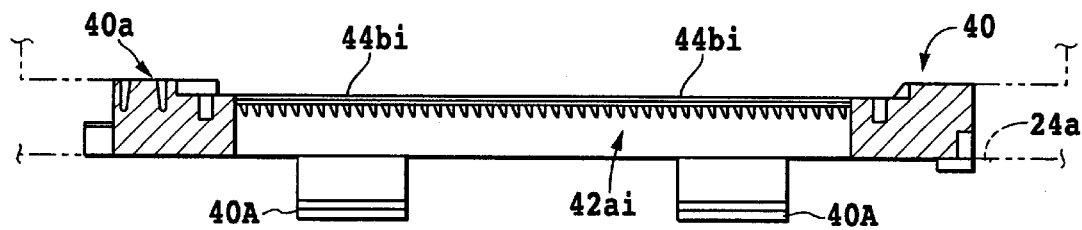
FIG. 8 is a cross sectional view taken along the line VIII—VIII indicated in FIG. 7.

The partition wall 44bi provided at a predetermined interval is disposed to correspond to the movable contact portions gap of the contact terminals 46ai described later. Each partition wall 44bi has a cross sectional configuration that is tapered toward the side of the socket body 24 as illustrated in FIG. 8.

Figure 11A:
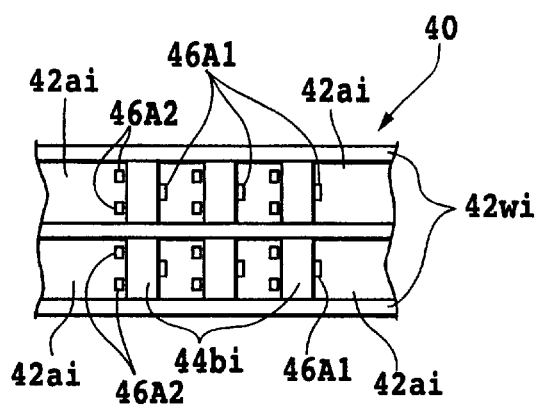
FIG. 11A is a plan view illustrating the contact deviation member in the example illustrated in FIG. 10 together with the contact terminal.
Figure 11B:
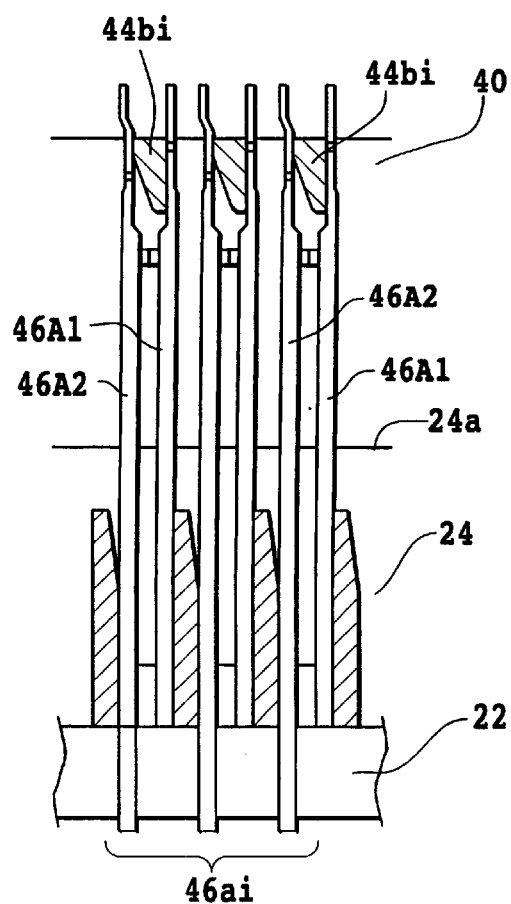
FIG. 11B is a partial cross sectional view of FIG. 11A.

As shown in FIGS. 11A and 11B, the foregoing contact terminals 46ai (i=1 to n, n is an integer.) are provided across the adjacent spaces 42ai. The contact terminal 46ai comprises a movable contact portion 46A1 and a bifurcated movable contact portion 46A2 provided oppositely to the movable contact portion 46A1.

The proximal end of the movable contact portion 46A1 shaped like a sheet is supported on a supporting member of the socket body 24 as illustrated in FIG. 10 and FIG. 11B. A terminal provided on the proximal end is electrically connected with the printed circuit board 22. The tip end of the movable contact portion 46A1 in contact selectively with the electrode portion 26a, has a smaller width than the width of its proximal end.

The movable contact portion 46A2 shaped like a sheet is disposed in opposition to the movable contact portion 46A1 across the partition wall 44bi. A gap is formed at the center of the bifurcated section at the tip end of the movable contact portion 46A2 such that the tip end of the movable contact portion 46A1 passes.

Figure 13:
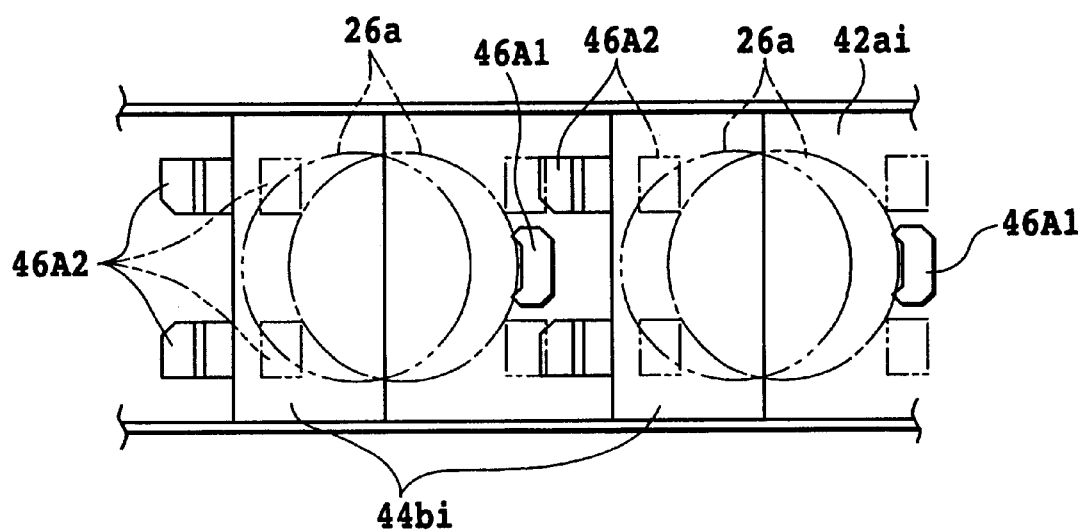
FIG. 13 is a partially enlarged view in section of FIG. 12A.

A chamfer section is formed at the inside of the tip end of the movable contact portion 46A2 and the outside of the tip end of the movable contact portion 46A1, as enlargedly illustrated in FIG. 13. This causes the tip end of the movable contact portion 46A2 and the tip end of the movable contact portion 46A1 to prevent the possibility of interfere. It is herein noticed that a circular-arc portion may be formed instead of the chamfer section.

The proximal end of the movable contact portion 46A2 join at a lower end of the aforementioned bifurcated portion and are coupled with each other. The proximal end of the movable contact portion 46A2 is supported on a support section of the socket body 24.

Figure 12A:
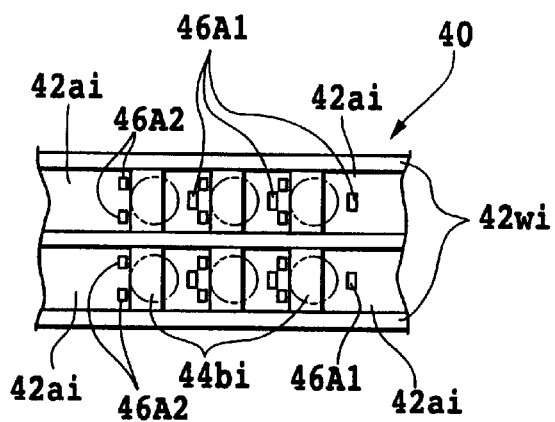
FIG. 12A is a view made available for the operation explanation in the example illustrated in FIG. 10.
Figure 12B:
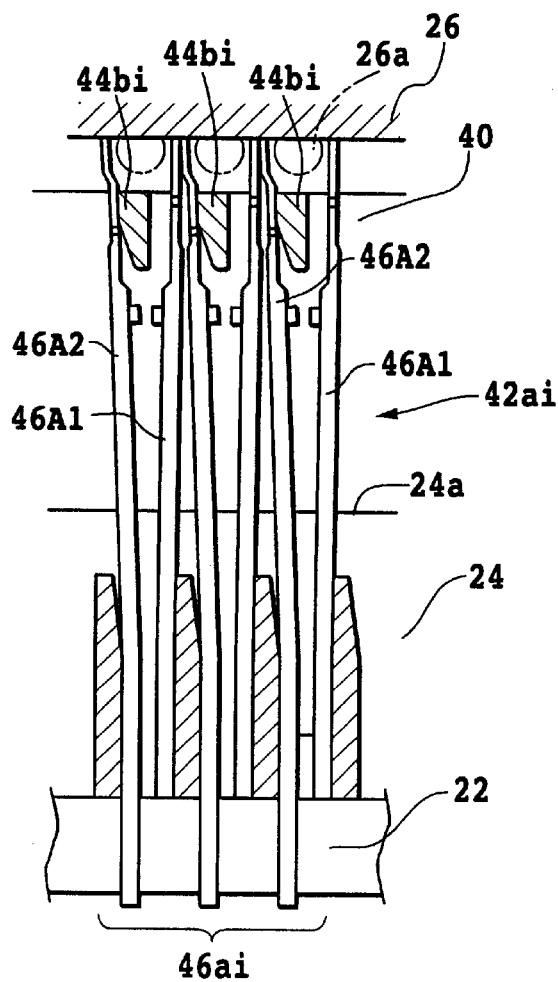
FIG. 12B is a partial cross sectional view of FIG. 12A.

Therefore, when the contact deviation member 40 is moved in the direction indicated by an arrow from a situation illustrated by FIGS. 11A and 11B to a state illustrated by FIGS. 12A and 12B, the movable contact portions 46A2 are pressed by the partition wall 44bi and are separated from the movable contact portion 46A1 and are moved up to a position adjacent to the movable contact portion 46A1 of the adjacent contact terminal 46ai.

In such a construction, when the semiconductor device 26 being mounted on the semiconductor device-socket the semiconductor device 26 held by a robot hand (not shown) is accommodated in the accommodation portion 30a of the positioning member 30 through the opening in the frame member 32, for example, in the same fashion as in the aforementioned example, the frame member 32 is first lowered with the aid of the robot hand up to a position indicated by the chain double-dashed line in FIG. 2. Thereupon, a predetermined gap is formed between the lower end surface of the frame member 32 and an upper end surface of the socket body 24.

Hereby, the contact deviation member 40 is moved against the urging force of the coiled spring 34. Accordingly, when the contact deviation member 40 is moved against the urging force of the coiled spring 34 in the direction indicated by an arrow illustrated in FIG. 12B, the partition wall 44bi in the situation at the first position illustrated in FIGS. 11A and 11B presses the movable contact portion 46A2 to separate it from the movable contact portion 46A1 and move the movable contact portion 46A2 up to a second position adjacent to the movable contact portion 46A1 of the adjacent contact terminal 46ai as indicated by a solid line in FIGS. 12A and 12B, and FIG. 13.

Then, as indicated by a solid line in FIG. 13, in the situation where the movable contact portion 46A2 of the contact terminal 46ai is separated from the movable contact portion 46A1 to be held, the semiconductor device 26 is placed on the bottom of the accommodation portion 30a of the positioning member 30 and is positioned, whereby the electrode portion 26a of the semiconductor device 26 is positioned between the movable contact portion 46A1 of the contact terminal 46ai and the movable contact portion 46A2 of the same through the opening 30d in the bottom thereof.

When the frame member 32 is raised by releasing force of the robot hand (not shown) and is suspended at the position indicated by the solid line in FIG. 2, the contact deviation member 40 is moved owing to the urging force of the coiled spring 34 and the restoring force of the movable contact portion 46A2 oppositely to then direction indicated by an arrow Mo, and is then interrupted.

Referring to the one point chain line in FIG. 13, the electrode 26a of the semiconductor device 26 is held between the movable contact portion 46A1 of the contact terminal 46ai and the movable contact portion 46A2 of the same.

Thereafter, a predetermined inspection signal is supplied to the semiconductor device 26 through a group of the contact terminals 46ai and the printed circuit board 22 in a predetermined atmosphere to execute a test for the semiconductor device 26.

When the semiconductor device 26 already tested is demounted from the semiconductor device-socket after the completion of the test, the frame member 32 is again lowered with the aid of the robot hand (not shown) up to the position indicated by the chain double-dashed line in FIG. 2, as described above, and then the movable contact portion 46A2 of the contact terminal 46ai is separated from the electrode 26a of the semiconductor device 26 and is moved up to the second position adjacent to the movable contact portion 46A1 of the adjacent contact terminal 46ai.

Subsequently, the frame member 32 is further lowered by a predetermined distance to move the movable contact portion 46A2 of the contact terminal 46ai beyond the aforementioned second position up to a third position where it abuts the adjacent electrode 26a in the direction of the movement of the contact deviation member 40.

Hereby, the back having the chamfer section in the movable contact portion 46A2 presses the adjacent electrode 26a in the semiconductor device 26 and move the electrode 26a such that it is separated by a predetermined distance from the movable contact portion 46A1.

Thereupon, the back in the movable contact portion 46A2 abuts the neighborhood of a portion with which the movable contact portion 46A1 makes contact in the adjacent electrode 26a from the second position separated away from the adjacent electrode 26a, i.e., the neighborhood of a central line of the electrode 26a putting the movable contact portion 46A1. Thereafter, the back is moved up to the third position where the electrode 26a is separated by a predetermined distance from the movable contact portion 46A1.

Accordingly, the relative size of the opening of the movable contact portion 46A2 with respect to the movable contact portion 46A1 is satisfactorily secured, and additionally the electrode 26a of the semiconductor device 26 is separated from the movable contact portion 46A1 of the contact terminal 36ai, so that the so-called biting of the movable contact portion 46A1 of the contact terminal 36ai is avoided. Further, there is eliminated the possibility that the surface of the electrode 26a of the semiconductor device 26 is damaged because the surface of the electrode 26a is pressed with the back of the movable contact portion 46A2.

Figure 14:
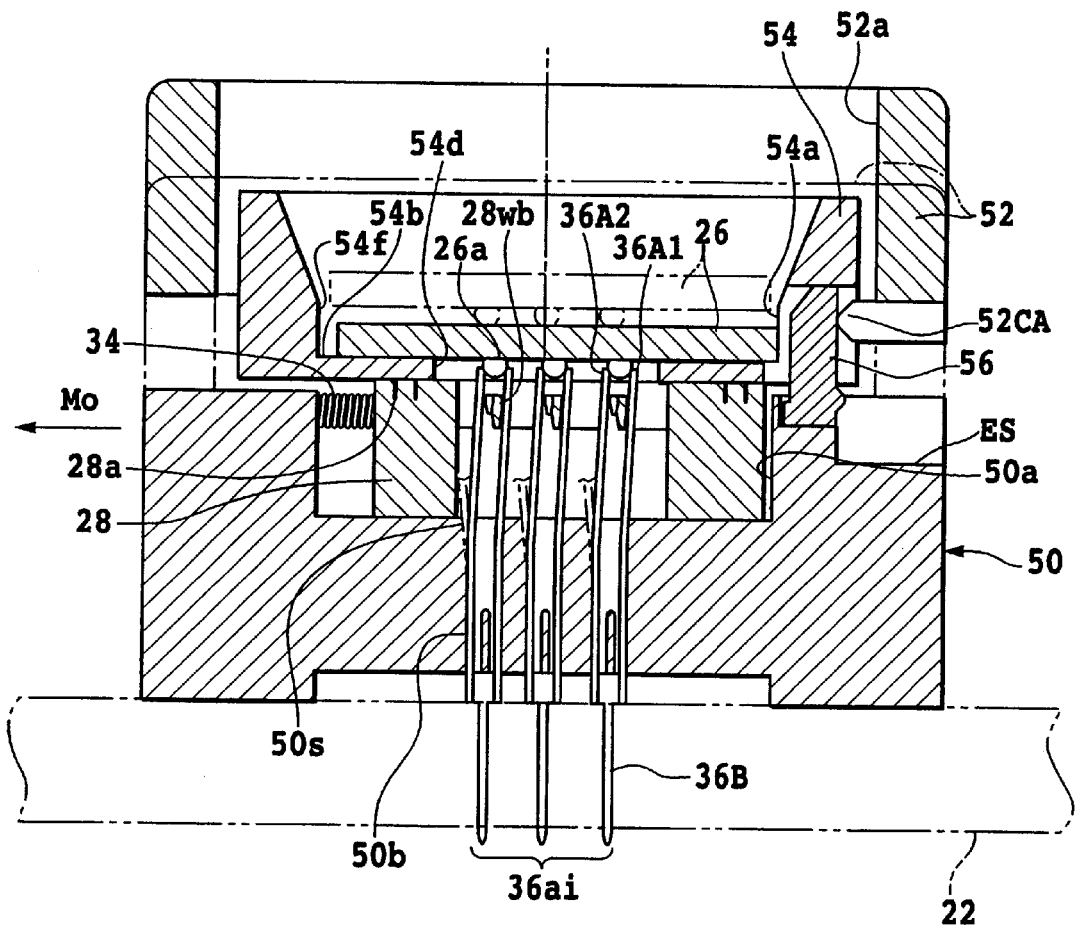
FIG. 14 is a cross sectional view schematically illustrating an important point of the construction of the third embodiment of the semiconductor device-socket according to the present invention together with the semiconductor device loaded on the socket.

FIG. 14 illustrates the construction of a third embodiment of the semiconductor device-socket according to the present invention together with the semiconductor device applied to them.

In FIG. 14, the same symbols shall be applied for the same constituent components as those in the example illustrated in FIG. 2, and hence overlapped description thereof will be neglected.

The semiconductor device-socket is disposed on the aforementioned printed circuit board 22. The socket comprises a socket body 50 fixed onto the printed circuit board 22 for accommodating a contact deviation member 28 described later relatively movably with respect to a pair of movable contact portions of the contact terminal 36ai, a positioning member 54 including an accommodation portion 54a in which the semiconductor device 26 is mounted, the foregoing contact deviation member 28, a frame member 52 for transmitting operating force to be acted on the contact deviation member 28 as driving force through a driving mechanism of the contact deviation member 28, and a cam follower member 56 as a press member for pressing an outer contour of the semiconductor device 26 by being moved by a predetermined distance with the frame member 52.

The socket body 50 includes there inside an accommodation portion 50a for accommodating he contact deviation member 28. The movable contact portions 36A2 and 36A1 of a plurality of the contact terminals 36ai are protruded into the contact deviation member 28. A plurality of through-holes 50b, into which the proximal end of the contact terminal 36ai is inserted with pressure, are provided in the bottom of the accommodation portion 50a. The through-holes 50b are provided corresponding to the electrodes 26a of the semiconductor device 26 to be mounted and a group of the electrodes of the printed circuit board 22. A slope 50s is formed on the side of the bottom of the accommodation portion 50a on the wall surface that forms each through-hole 50b. The slope 50s is inclined to the right and downward as indicated by a chain double-dashed lineo as to guide the one movable contact portion 36A2 of the contact terminal 36ai.

Figure 15:
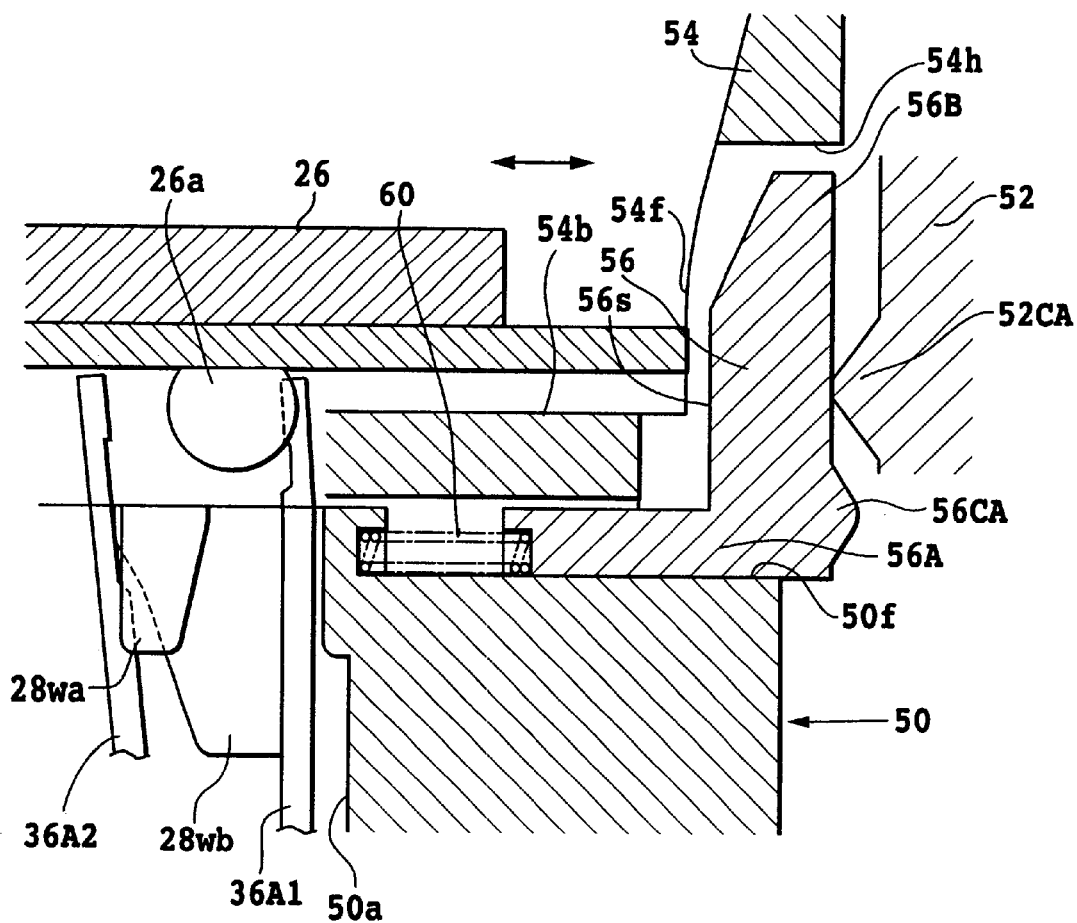
FIG. 15 is a partially enlarged cross sectional view illustrating important point of the example illustrated in FIG. 14.

The cam follower member 56 is slidably provided on a flat section 50f on a peripheral edge of the accommodation portion 50a of the socket body 50, as illustrated in FIGS. 14 and 15. Relief ES is formed on the outside of the flat section 50f of the socket body 50 for avoiding interference with the cam section of the frame member 52.

The cam follower member 56 having an L shaped cross sectional configuration includes a flat plate shaped section 56A that makes slidable contact with the flat section 50f in both directions indicated by a bidirectional arrow in FIG. 15, and an inverted section 56B intersecting the flat plate shaped section 56A.

At a predetermined position of the inverted section 56B a mildly raising follower section 56CA is formed on the aside of the frame member 52. The follower section 56CA is selectively engaged with the cam section of the frame member 52 described later. Inside the inverted section 56B there is formed the press surface 56s for selectively pressing the outer contour of the semiconductor device 26. The press surface section 56s is formed such that the slope section and the flat surface inside the inverted section 56B are coupled with each other.

A coiled spring 60 is provided between the one end of flat plate shaped section 56A and a closed end of the flat section 50f for urging the cam follower member 56 in the direction where the follower cam member is separated from the socket body 50 to the side of the frame member 52.

In the upper end of the contact deviation member 28, on which a bottom of the positioning member 54 is placed, there are provided at four positions the recessed portions 28a each having a cylindrical cross sectional configuration which is engaged with a protrusion on the positioning member 54 when the contact deviation member 28 is moved in one direction.

Accordingly, the contact deviation member 28 disposed between the bottom of the positioning member 54 and the bottom surface of the accommodation portion is made relatively slidable over a predetermined range for the bottom surface of the accommodation portion 50a.

A pair of engagement pins (not shown) provided on the outer periphery of the contact deviation member 28 are each coupled with an elongated hole in the lever member of the driving mechanism for moving the contact deviation member 28 in response to the elevation operation of the frame member 52. The engagement pins are provided on the side of the one end of the contact deviation member 28, for example.

The proximal end of each lever member of the driving mechanism has a transparent hole engaged rotatably with a support shaft provided on an inner periphery of the accommodation portion 50a of the socket body 50. The tip end of each lever member is disposed at all times in contact with a lower end surface of the frame member 52 or with a predetermined gap oppositely to the latter.

The frame member 52 having the opening portion 52a is supported elevatably with respect to the socket body 50, and includes a pointed cam section 52CA engaged with the cam follower section 56CA of the aforementioned cam follower member 56 at its lower end. The tip end of the cam section 52CA is in abutment with an outer peripheral surface of the inverted section 56B of the cam follower member 56 up to a predetermined lowering position, as illustrated in FIGS. 15 and 16.

The inner peripheral surface of the positioning member 54 is so formed as to be surrounded by the flat surface 54f with which an end surface of one side in the rectangle semiconductor device 26 and both side surfaces communicated with the former are in abutment, a slope section 54s for coupling an upper en surface of the flat surface and the flat surface 54f, and a bottom surface section 54b intersecting the flat surface 54f. The opening portion 54d is formed in the bottom surface 54b.

An interdistance between the opposite flat surfaces in the positioning member 54 is set larger with predetermined tolerance than the length of one side of the semiconductor device 26 to be mounted.

Figure 16:
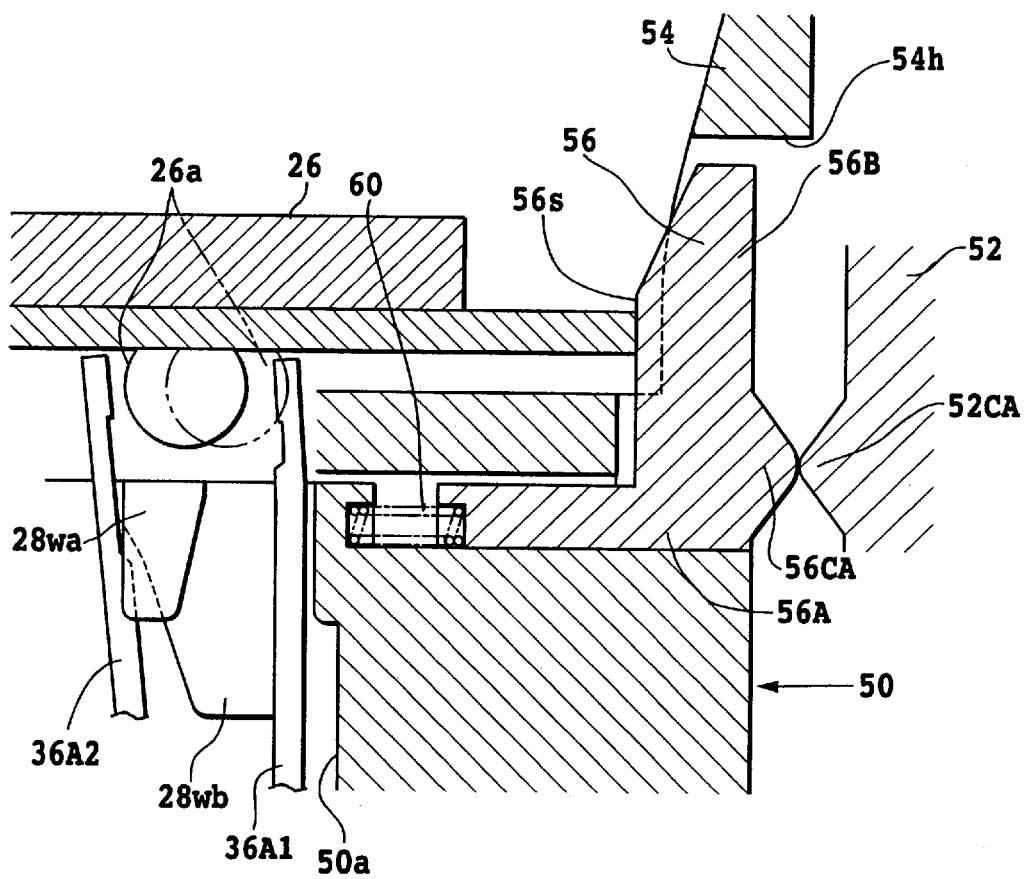
FIG. 16 is a partially enlarged cross sectional view, made available for the operation explanation of the example illustrated in FIG. 14.

Referring here to FIG. 16, an opening portion 54h through which the inverted section 56B passes in a portion of the cam follower member 56 opposite to the inverted section 56B in the positioning member 54.

Hereby, as illustrated in FIG. 16, when the follower section 56CA of the cam follower member 56 is engaged wit the cam section 52CA of the lowered frame member 52, the cam follower member 56 enters into the positioning member 54 through the opening portion 54h against the urging force of the coiled spring 60.

Figure 17:
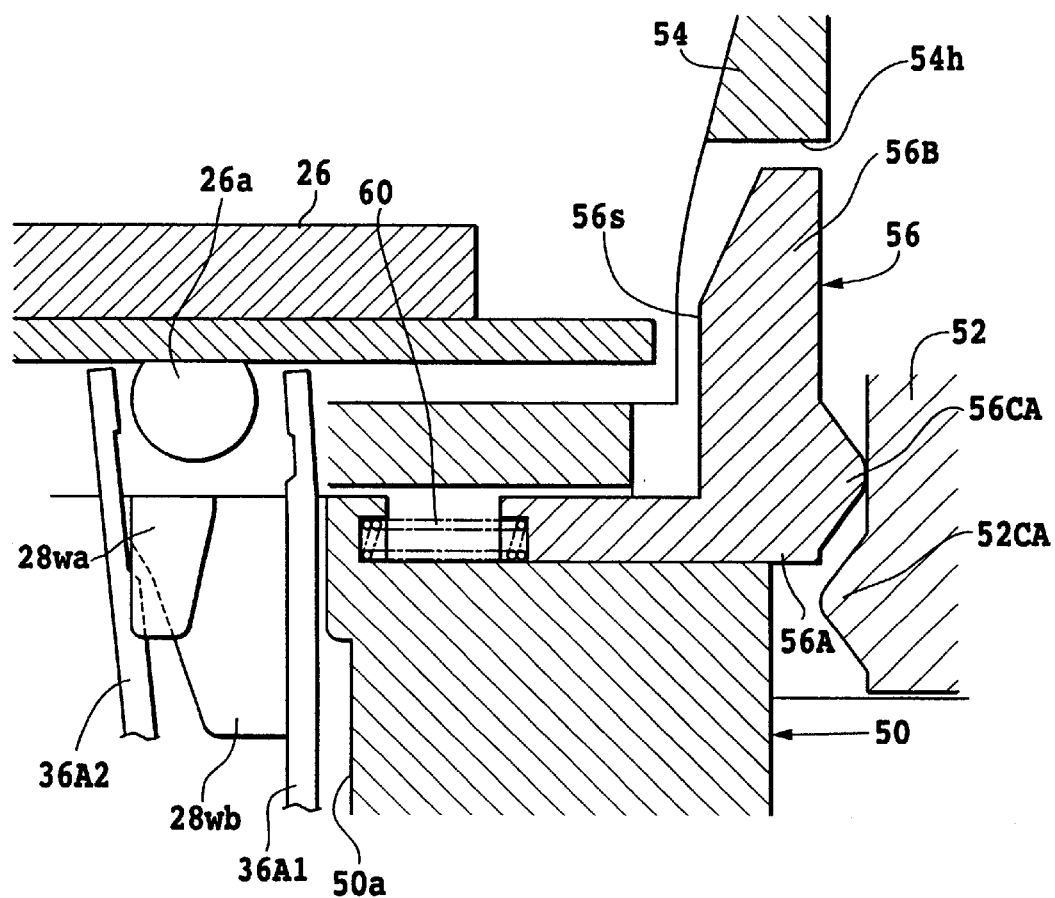
FIG. 17 is a partially enlarged cross sectional view, made available for the operation explanation of the example illustrated in FIG. 14.
Figure 18:
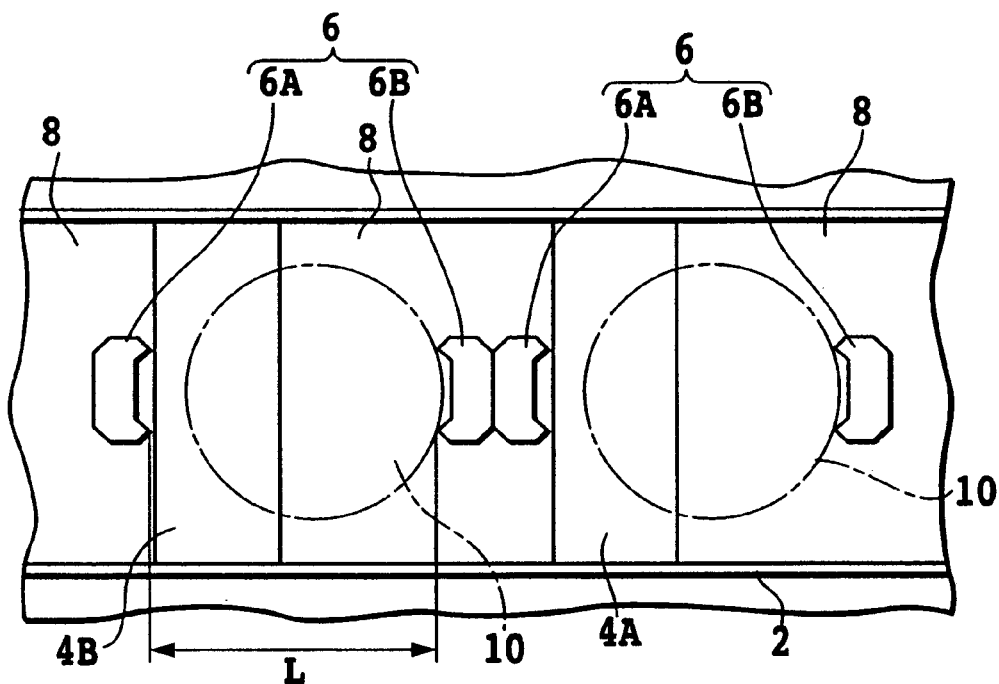
FIG. 18 is a partial plan view illustrating the arrangement of the contact terminal disposed on a contact deviation member in a conventional apparatus.

In contrast, as illustrated in FIG. 17, when the cam section 52CA of the frame member 52 is further lowered, the cam follower 56CA is returned to an original position with the urging force of the coiled spring 60, and then the gap end thereof is brought into abutment with the inner peripheral surface of the inverted section 56B of the cam follower member 56. The cam follower member 56 is withdrawn from the positioning member 54.

In such construction, upon the semiconductor device 26 being mounted on the semiconductor device-socket, in the case where the semiconductor device 26 held by a robot hand (not shown) is accommodated in the accommodation portion 54a of the positioning member 54 through the opening portion 52a of the frame member 52, the camsection 52CA of the framer member 52 is first lowered with the robot hand up to a position indicated by a solid line in FIG. 15. Thereupon, a predetermined gap is formed between the lower end surface of the frame member 52 and the upper end surface of the socket body 50.

The contact deviation member 28 is hereby moved with a moving mechanism of the contact deviation member 28 against the urging force of the coiled spring 34 in the direction indicated by an arrow Mo illustrated in FIG. 14. Accordingly, when the contact deviation member 28 is moved in the direction indicated by the arrow Mo, the partition wall portion 28Wb staying at the first position presses against the movable contact portion 36A2 to separate it from the movable contact portion 36A1 and move the movable contact portion 36A2 up to the second position adjacent to the movable contact portion 36A1 of the adjacent contact terminal 36ai.

Referring then to FIG. 15, in the situation where the movable contact portion 36A2 of the contact terminal 36ai is separated from and is held by the movable contact portion 36A1, the semiconductor device 26 is placed o the bottom of the accommodation portion 54a of the positioning member 54 and is positioned, whereby the electrode portion 26a of the semiconductor device 26 is positioned between the movable contact portion 36A1 of the contact terminal 36ai and the movable contact portion 36A2 of the same through the opening portion 54d in the bottom thereof.

When the frame member 52 is raised with a robot had (not shown) and is interrupted at a position indicated by a solid line in FIG. 14, the contact deviation member 28 is moved with the aid of the urging force of the coiled spring 34 and the restoring force of the movable contact portion 36A2, and thereafter the contact deviation member 28 is interrupted.

As illustrated in FIG. 14, the electrode 26a of the semiconductor device 26 is held between the movable contact portion 36A1 of the contact terminal 36ai and the movable contact portion 36A2 of the same.

Thereafter, in a predetermined atmosphere, a predetermined inspection signal is supplied to the semiconductor device 26 through the printed circuit board and a group of the contact terminals 36ai to execute a test for the semiconductor device 26.

Further, after the completion of the test, upon the semiconductor device 26 being demounted from the semiconductor device-socket, the frame member 52 is again lowered with a robot hand (not shown) up to a position indicated by a chain double-dashed line in FIG. 14 as described above, and then as illustrated in FIG. 15 the movable contact portion 36A2 of the contact terminal 36ai is separated from the electrode portion 26a of the semiconductor device 26, and is moved up to a second position adjacent to the movable contact portion 36A1 of the adjacent contact terminal 36ai.

Subsequently, the frame member 52 is further lowered by a predetermined distance to move the movable contact portion 36A2 of the contact terminal 36ai up to a third position beyond the foregoing second position.

Thereupon, the slope of the follower section 56CA of the cam follower member 56 is engaged with the tip end of the cam section 52CA of the frame member 52 to be lowered and is gradually pressed toward the semiconductor device 26 in the positioning member 54.

Further, as illustrated in FIG. 16, the top of the follower section 56CA of the cam follower member 56 and the top of the cam section 52CA of the frame member 52 are substantially coincident with each other, the press surface section 56s of the cam follower member 56 abuts the outer contour of the semiconductor device 26 in the positioning member 54 through the opening portion 54h against the urging force of the coiled spring 60 and is then forced to enter the same by a predetermined distance.

Accordingly, the semiconductor device 26 is moved such that it is separated from the movable contact portion 36A1, as illustrated in FIG. 16.

In addition, in the same fashion as in the aforementioned example, the flat back with no protrusion in the movable contact portion 36A2 presses the adjacent electrode portion 26a in the semiconductor device 26, and is moved to separate it from the movable contact portion 36A1 by a predetermined distance L.

Accordingly, since the electrode portion 26a of the semiconductor device 26 is securely separated from the movable contact portion 36A1 of the contact terminal 36ai, the so-called bite of the movable contact portion 36A1 of the contact terminal 36ai is avoided. Further, the surface of the electrode portion 26a of the semiconductor device 26 is pressed by the flat back in the movable contact portion 36A2, or the outer contour of the semiconductor device 26 is pressed by the press surface section 56s of the cam follower member 56, so that there is no possibility that the surface of the electrode portion 26a of the semiconductor device 26 is damaged.

Referring further to FIG. 17, when the top of the cam section 52CA of the frame member 52 is lowered beyond the top of the follower section 56CA the cam follower member 56 is separated from the outer contour of the semiconductor device 26 and is withdrawn through the opening portion 54h and is returned to an initial position.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor device-socket comprising:
   a plurality of contact terminals, each of which includes a first movable contact portion and a second movable contact portion slantwise disposed and opposite to the direction of movement of the first movable contact, for selectively pinching an electrode portion of a semiconductor device in cooperation with said first movable contact, and electrically connects said electrode portion of said semiconductor device;

a supporting member for supporting proximal ends of said plurality of contact terminals such that said first movable contact portion of said adjacent one of said contact terminals and said second movable contact portion of the other contact terminal are adjacent to each other;

a contact deviation member disposed relatively movably with respect to said supporting member, said contact deviation member including a press section for pressing said first movable contact portion in such manner as to press said first movable contact portion of said contact terminal against said second movable contact portion so as to bring said first movable contact portion into or out of close proximity to said second movable contact portion and separate said electrode portion of said semiconductor device from said second movable contact; and driving means for relatively moving said contact deviation member with respect to said supporting member.

2. A semiconductor device-socket as claimed in claim 1 wherein said plurality of said contact terminal section are disposed so that when said first movable contact portions are pressed such that a row of said first movable contact portions and a row of said second movable contact portions are arranged substantially in parallel to each other and said electrode of said semiconductor device is separated from said second movable contact portions, said second movable contact portions are disposed between said adjacent first movable contact portions.

3. A semiconductor device-socket as claimed in claim 1 wherein said first movable contact is formed into a bifurcated configuration having a gap oppositely to said second movable contact.

4. A semiconductor device-socket as claimed in claim 1 wherein said press section of said contact deviation member is a partition wall for dividing said first movable contact portion of said one of said adjacent contact terminals and said first movable contact portion of the other of the same.

5. A semiconductor device-socket as claimed in claim 1 wherein a partition wall is formed around said press section of said contact deviation member for dividing between said first movable contact portion of said contact terminal and said second movable contact portion.

6. A semiconductor device-socket as claimed in claim 1 wherein when said first movable contact portion is pressed by said press section such that said electrode of said semiconductor device is separated from said second movable contact portion, said electrode of said semiconductor device is pressed along a central axis of said electrode of said semiconductor device by said back of said first movable contact portion.

7. A semiconductor device-socket as claimed in claim 3 wherein when said first movable contact portion is pressed by said press section such that said electrode of said semiconductor device is separated from said second movable contact portion, said electrode of said semiconductor device is pressed by said back of said first movable contact portion.

8. A semiconductor device-socket as claimed in claim 7 wherein when said electrode of said semiconductor device is pressed by said back of said first movable contact portion, said first movable contact portion passes through opposite ends of said second movable contact portion in the direction of the width of said second movable contact portion through said gap.

9. A semiconductor device-socket comprising:

a plurality of contact terminals, each of which includes a first movable contact portion and a second contact portion for selectively pinching an electrode portion of said semiconductor device in cooperation with said first movable contact portion and electrically connects said electrode portion of said semiconductor device;

a positioning member including an accommodation portion for accommodating said semiconductor device therein, said positioning member for relatively positioning said electrode portion of said semiconductor device with respect to said first movable contact portion and said second movable contact portion;

a supporting member for supporting said proximal ends of said plurality of contact terminals;

a contact deviation member disposed relatively movably with respect to said supporting member, said contact deviation member including a press section for pressing said first movable contact portion of said contact terminal section in such a manner as to press said first movable contact portion against said second movable contact portion so as to bring said first movable contact portion into or out of close proximity to said second movable contact portion; and a press member including a press surface section for pressing an outer configuration section of said semiconductor device in a direction in which said electrode portion of said semiconductor device accommodated in said accommodation portion is separated from said second movable contact portion, when said first movable contact portion is separated from said second movable contact portion by said contact deviation member.

10. A semiconductor device-socket as claimed in claim 9 wherein said plurality of said contact terminals, each of which includes a first movable contact portion and a second movable contact portion slantwise disposed and opposite to the direction of movement of said first movable contact, for selectively pinching an electrode portion of a semiconductor device in cooperation with said first movable contact, and electrically connects said electrode portion of said semiconductor device, said supporting member supports proximal ends of said plurality of contact terminals such that said first movable contact portion of said adjacent one of said contact terminals and said second movable contact portion of the other contact terminal are adjacent to each other.

11. A semiconductor device-socket as claimed in claim 9 wherein said press section of said contact deviation member is a partition wall for dividing said first movable contact portion of said one of said adjacent contact terminals and said first movable contact portion of the other of the same.

12. A semiconductor device-socket as claimed in claim 9 wherein a partition wall is formed around said press section of said contact deviation member for dividing between said first movable contact portion of said contact terminal and said second movable contact portion.

13. A semiconductor device-socket as claimed in claim 9 wherein when said first movable contact portion is pressed by said press section such that said electrode of said semiconductor device is separated from said second movable contact portion, said electrode of said semiconductor device is pressed along a central axis of said electrode of said semiconductor device by said back of said first movable contact portion.

* * * * *